United States Patent
Lehr et al.

(10) Patent No.: US 8,053,354 B2
(45) Date of Patent: Nov. 8, 2011

(54) REDUCED WAFER WARPAGE IN SEMICONDUCTORS BY STRESS ENGINEERING IN THE METALLIZATION SYSTEM

(75) Inventors: Matthias Lehr, Dresden (DE); Frank Koschinsky, Radebeul (DE); Joerg Hohage, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 68 days.

(21) Appl. No.: 12/561,701

(22) Filed: Sep. 17, 2009

(65) Prior Publication Data
US 2010/0109131 A1    May 6, 2010

(30) Foreign Application Priority Data
Oct. 31, 2008  (DE) .................. 10 2008 054 069

(51) Int. Cl.
*H01L 21/4763*  (2006.01)
(52) U.S. Cl. ........ 438/622; 438/618; 438/624; 438/638; 257/E21.579; 257/E21.585
(58) Field of Classification Search ............ 257/E21.536
See application file for complete search history.

(56) References Cited

U.S. PATENT DOCUMENTS

| | | | |
|---|---|---|---|
| 6,432,845 B1 | 8/2002 | Morozumi | 438/789 |
| 7,005,724 B2 | 2/2006 | Rossi et al. | 257/649 |
| 7,247,556 B2 | 7/2007 | Nanda et al. | 438/624 |
| 2004/0227242 A1* | 11/2004 | Noguchi et al. | 257/751 |
| 2007/0267724 A1 | 11/2007 | Jeng et al. | 257/632 |

FOREIGN PATENT DOCUMENTS

| | | |
|---|---|---|
| DE | 102004042168 A1 | 3/2006 |
| EP | 0 851 480 A2 | 7/1998 |
| JP | 04333225 A | 11/1992 |
| JP | 2002033386 A | 1/2002 |
| JP | 2008244032 A | 10/2008 |

OTHER PUBLICATIONS

Translation of Official Communication from German Patent Office for German Patent Application No. 10 2008 054 069.2 dated Sep. 2, 2009.

* cited by examiner

*Primary Examiner* — Cheung Lee
(74) *Attorney, Agent, or Firm* — Williams, Morgan & Amerson, P.C.

(57) ABSTRACT

In complex metallization systems of sophisticated semiconductor devices, appropriate stress compensation mechanisms may be implemented in order to reduce undue substrate deformation during the overall manufacturing process. For example, additional dielectric material and/or functional layers of one or more metallization layers may be provided with appropriate internal stress levels so as to maintain substrate warpage at a non-critical level, thereby substantially reducing yield losses in the manufacturing process caused by non-reliable attachment of substrates to substrate holders in process and transport tools.

16 Claims, 8 Drawing Sheets

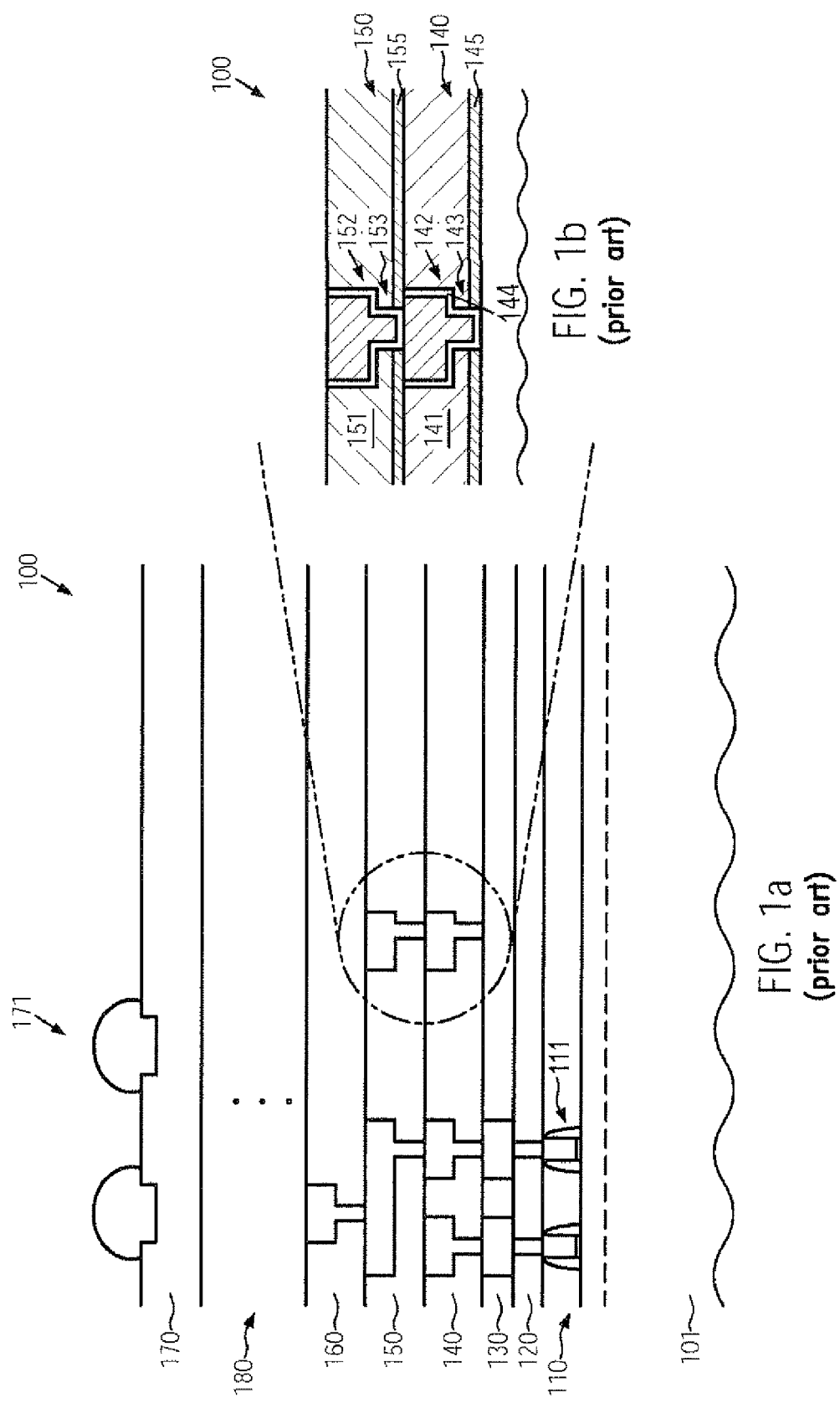

REDUCED WAFER WARPAGE IN SEMICONDUCTORS BY STRESS ENGINEERING IN THE METALLIZATION SYSTEM

BACKGROUND OF THE INVENTION

1. Field of the Invention

Generally, the present disclosure relates to the field of integrated circuits, and, more particularly, to integrated circuits requiring a complex metallization system including a high number of metallization layers.

2. Description of the Related Art

Semiconductor devices are typically formed on substantially disc-shaped substrates made of any appropriate material. The majority of semiconductor devices including highly complex electronic circuits are currently, and in the foreseeable future will be, manufactured on the basis of silicon, thereby rendering silicon substrates and silicon-containing substrates, such as silicon-on-insulator (SOI) substrates, viable carriers for forming semiconductor devices, such as microprocessors, SRAMs, ASICs (application specific ICs) and the like. The individual integrated circuits are arranged in an array form, wherein most of the manufacturing steps, which may involve up to several hundred individual process steps in sophisticated integrated circuits, are performed simultaneously for all chip areas on the substrate, except for photolithography processes, metrology processes and packaging of the individual devices after dicing the substrate. Thus, economic constraints drive semiconductor manufacturers to steadily increase the substrate dimensions, thereby also increasing the area available for producing actual semiconductor devices and thus increasing production yield. At the same time, device dimensions are also being reduced in view of performance criteria, as typically lower transistor dimensions provide increased operating speed.

In modern integrated circuits, the circuit elements are formed in and on a semiconductor layer, while most of the electrical connections are established, due to the high packing density of the circuit elements in the device level, in a plurality of "wiring" layers, also referred to as metallization layers, wherein the electrical characteristics, such as resistivity, electromigration, etc., of the metallization layers significantly affect the overall performance of the integrated circuit. Electromigration is a phenomenon of electric field induced material transport in a metal line, which is observable at higher current densities in a metal line, thereby resulting in device degradation or even device failure.

Due to the ongoing demand for shrinking the feature sizes of highly sophisticated semiconductor devices, metals of superior conductivity, such as copper and the like, in combination with sophisticated dielectric materials, have become a frequently used alternative in the formation of metallization systems comprising metallization layers having metal line layers and intermediate via layers. Metal lines act as intralayer connections and vias act as inter-layer connections, thereby connecting the individual circuit elements in the device layer to provide the required functionality of the integrated circuit. Typically, a plurality of metal line layers and via layers stacked on top of each other are necessary to realize the connections between all internal circuit elements and I/O (input/output), power and ground pads of the circuit design under consideration.

For extremely scaled integrated circuits, the signal propagation delay is no longer limited by the circuit elements in the device levels, such as transistors, but is limited—owing to the increased density of circuit elements, which requires an even more increased number of electrical connections between these circuit elements—by the close proximity of the metal lines, since the line-to-line capacitance is increased. This fact, in combination with a reduced conductivity of the lines due to a reduced cross-sectional area, results in increased RC time constants. For this reason, traditional dielectrics such as silicon dioxide and silicon nitride are increasingly replaced in metallization layers by dielectric materials having a lower permittivity, which are, therefore, also referred to as low-k dielectrics having a relative permittivity of approximately 3 or less.

Furthermore, due to the ongoing shrinkage of feature sizes of the circuit elements in the device layer, the available floor space for forming the metallization system of the semiconductor device may also have to be adapted to the increased packing density. Since, typically, many of the circuit elements formed in the device level may require two or more electrical connections, the number of mutual electrical connections may over-proportionally increase with increasing packing density in the device level, thereby typically requiring an increased number of stacked metallization layers in order to comply with the complexity of the circuit layout under consideration. For this reason, in sophisticated semiconductor devices, such as microprocessors, complex storage devices and the like, the number of stacked metallization layers may increase although sophisticated materials in the form of highly conductive metal components, such as copper and the like, in combination with dielectric materials of reduced permittivity, may increasingly be used. Consequently, as the number of stacked metallization layers may increase, and additionally in each of the metallization layers a complex composition of materials in the form of etch stop layers, interlayer dielectric materials, conductive barrier layers, cap layers and the like may be required, the entire metallization system of the semiconductor device may have a significant influence on the overall performance of the device but also may increasingly influence the overall manufacturing flow. For example, the density and mechanical stability or strength of the low-k dielectric materials may be significantly less compared to well-approved dielectrics such as silicon dioxide and silicon nitride. Moreover, due to copper's characteristics of being readily diffused in a plurality of dielectric materials, an efficient confinement of the copper material may also be guaranteed, thereby requiring conductive barrier materials, dielectric or conductive cap layers and the like, each of which may require respective material compositions and deposition techniques. For example, the substrate handling for the various process steps required for completing the complex metallization system may be significantly affected by the composition and the number of stacked metallization layers, as will be described in more detail with reference to FIGS. 1a-1b.

FIG. 1a schematically illustrates a cross-sectional view of a conventional semiconductor device 100, in which a metallization system 180 is formed above a substrate 101. Typically, the substrate 101 may represent a silicon substrate or an SOI substrate, which may be divided into a plurality of die regions (not shown), each of which may represent a semiconductor device in an intermediate manufacturing stage, i.e., semiconductor device prior to separating the substrate 101 into individual chips. The substrate 101 typically has formed thereon a device layer 110, which is to be understood as any appropriate semiconductor layer or layers required for forming respective circuit elements, such as transistors, capacitors, resistors and the like. For convenience, a plurality of elements 111 is illustrated, wherein it should be appreciated that a very large number of corresponding circuit elements may be provided within each die, depending on the overall complexity of the circuit configuration under consideration. For instance, in sophisticated microprocessors, several hundred million transistors may be provided. Furthermore, a contact structure 120 is typically provided to act as an electric interface between the device level 110 and the metallization system 180. For instance, the contact structure 120 may be comprised of any appropriate dielectric material for enclosing and passivating the circuit elements 111 and also accommodating corresponding contact elements, which may connect to metal lines of the contact structure layer 120 of the metallization system 180. Moreover, as previously indicated, a plurality of additional metallization layers 130, 140, 150, 160 and 170 may be provided depending on the circuit layout of the device 100. In principle, each of the metallization layers 120, 130, 140, 150, 160 may have a similar composition, i.e., metal lines and vias may be formed in accordance with the overall circuit layout in an appropriate dielectric material, wherein respective additional materials, such as etch stop materials, conductive and dielectric barrier materials and the like, are typically provided as required. Moreover, as schematically illustrated in FIG. 1a, a last metallization layer 170 may typically be provided if an appropriate structure is provided to connect the metallization system 180 to the periphery, for instance in the form of a printed wiring board, a device package, or any other carrier substrate in accordance with the further handling of the device 100. For example, a bump structure 171 may be provided to enable direct contact with corresponding bumps or contact pads of a carrier substrate. In other cases, appropriate bond pads may be provided in order to enable contact with a bond wire, which may be used for establishing the electrical connection to the periphery.

FIG. 1b schematically illustrates an enlarged view of a portion of the metallization system 180. As illustrated, the portion of the metallization layer 140 comprises a dielectric material 141, which may be provided in the form of a material composition including different materials while, in sophisticated applications, the dielectric material 141 may comprise a significant amount of a low-k dielectric material or even an ultra low-k (ULK) material, which may have a dielectric constant of 2.7 and less. Furthermore, an etch stop layer 145 is typically provided as a first layer of the metallization layer 140 or may be considered as a final layer of a lower lying metallization layer and has typical etch stop capabilities with respect to the interlayer dielectric material 141 with respect to a patterning sequence for forming openings for a via 143. Moreover, a metal line 142 is illustrated wherein, in the example shown, the via 143 and the metal line 142 may both comprise a common conductive barrier material 144, such as tantalum, tantalum nitride and the like, which are well-established barrier materials for enhancing adhesion of the highly conductive metal, such as copper, provided in the metal line 142 and the via 143, while also providing the required copper integrity and performance with respect to electromigration. Similarly, the metallization layer 150 may comprise an etch stop layer 155 comprised of an appropriate dielectric material 151, in which are embedded a metal line 152 and a via 153. It should be appreciated that other materials may be used for the dielectric material 151 compared to the material 141 depending on the overall configuration of the semiconductor device 100.

As previously discussed, a plurality of complex manufacturing steps are typically required for forming the metallization system 180, wherein, for convenience, a corresponding manufacturing sequence for the layers 140 and 150 may be described. Hence, after forming the metallization layer 130 (FIG. 1a), the etch stop layer 145 is deposited, for instance in the form of a silicon nitride material, a nitrogen-containing silicon carbide material and the like. For this purpose, well-established plasma enhanced deposition techniques are available. Subsequently, the dielectric material 141 may be provided by one or more deposition steps, such as chemical vapor deposition (CVD), spin-on techniques and the like. Thereafter, a complex patterning sequence has to be performed on the basis of sophisticated lithography processes to form the corresponding openings for the via 143 and the metal line 142. It should be appreciated that a plurality of process strategies are currently practiced in order to form the metal line 142 and the via 143. Irrespective of the corresponding manufacturing flow, a plurality of critical deposition and patterning steps are to be performed, wherein the process results may increasingly be determined by the overall configuration of the metallization system 180. That is, due to the very different materials and treatments to be performed on the previously deposited material layers, a certain degree of deformation or warpage of the substrate 101 may be caused, which in turn may have a significant influence on the substrate handling during the entire processing of the device 100. For example, critical lithography processes may be severely influenced by the position of the corresponding substrate portions on a corresponding substrate holder so that the finally obtained lithography result may depend on the characteristics of the substrate 101. Moreover, an even further increased degree of deformation or warpage may result in a non-reliable attachment of the substrate 101 to the various substrate holders of process tools and transport equipment, thereby resulting in a significant risk of damage of the substrate or other related substrates.

Consequently, upon filling the corresponding openings in the dielectric material 141 by depositing the conductive barrier material 144 followed by the electrochemical deposition of the copper material and the corresponding removal of any excess material, the further processing may have to be performed on the basis of an even further increased substrate warpage, depending on the materials and the processes involved in forming the metallization layer 140. Similarly, the etch stop layer 155 may be deposited, followed by the deposition of the dielectric material 151 and the patterning thereof, wherein the previous metallization layers as well as the additional material layers 155 and 151 influence the mechanical characteristics of the substrate 101 so that a high risk of loss of substrates may be encountered during the manufacturing of the metallization system 180, which may even increase for higher metallization layers. Consequently, due to mechanical influence of the metallization system 180 on the substrate 101, a significantly reduced reliability during substrate handling activities may occur, in particular at a very late stage of the overall manufacturing flow, thereby contributing to increased yield losses at a manufacturing stage in which most of the process flows have already been completed.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to manufacturing techniques and corresponding semiconductor devices in which the mechanical stress level in the metallization system may be monitored and may be appropriately balanced at any appropriate manufacturing stage in order to maintain substrate warpage or deformation at a non-critical state. For this purpose, additional materials and/or respective dielectric materials and/or conductive materials required in the metallization system may be provided in the form of "stress compensation" layers, which may balance the overall stress characteristics in the metallization system such that a corresponding warpage or substrate deformation may remain below a critical value. For example, the influence of increasingly stacking metallization layers on the resulting wafer warpage may be monitored to identify a corresponding critical number of metallization layers and their composition so as to introduce an appropriate stress compensation mechanism that provides a non-critical substrate warpage for the specific metallization system and process sequence under consideration. In illustrative aspects disclosed herein, the stress characteristics of specified material layers may be adapted in view of appropriately balancing the overall stress characteristics, while, in other cases, in addition to or alternatively to these measures, additional material layers may be introduced in order to "re-adjust" the entire stress behavior of the metallization system to obtain a non-critical substrate warpage. By adding additional stress compensation materials, well-established process techniques and material compositions for the metallization system may be substantially maintained, thereby providing a high degree of compatibility with conventional manufacturing strategies, while nevertheless significantly reducing the probability of yield losses at a very advanced manufacturing stage.

One illustrative method disclosed herein comprises determining a degree of warpage of a first substrate when performing a manufacturing sequence for forming a plurality of metallization layers of a first metallization system of a specified type of semiconductor device above the first substrate. The method additionally comprises adjusting an overall stress level in a second metallization system on the basis of the determined degree of warpage when forming the second metallization system of the specified type of semiconductor device above at least one second substrate.

One further illustrative method disclosed herein relates to reducing warpage of a substrate of a semiconductor device. The method comprises forming a metallization system above the substrate, wherein the metallization system comprises a plurality of metallization layers. Furthermore, the method comprises forming one or more stress compensation layers in the metallization system to maintain an overall warpage of the substrate below a predefined threshold.

One illustrative semiconductor device disclosed herein comprises a substrate and a metallization system. The metallization system comprises a plurality of metallization layers formed above the substrate. Furthermore, the metallization system comprises one or more stress compensating regions having a different type of intrinsic stress compared to materials in the neighborhood of the one or more stress compensation regions to balance an overall stress of the metallization system.

BRIEF DESCRIPTION OF THE DRAWINGS

The disclosure may be understood by reference to the following description taken in conjunction with the accompanying drawings, in which like reference numerals identify like elements, and in which:

FIG. 1a schematically illustrates a cross-sectional view of a semiconductor device comprising a complex metallization system which may result in substrate warpage during the manufacturing process, according to conventional strategies;

FIG. 1b schematically illustrates an enlarged view of a portion of the metallization system of FIG. 1a;

Figure 2A:
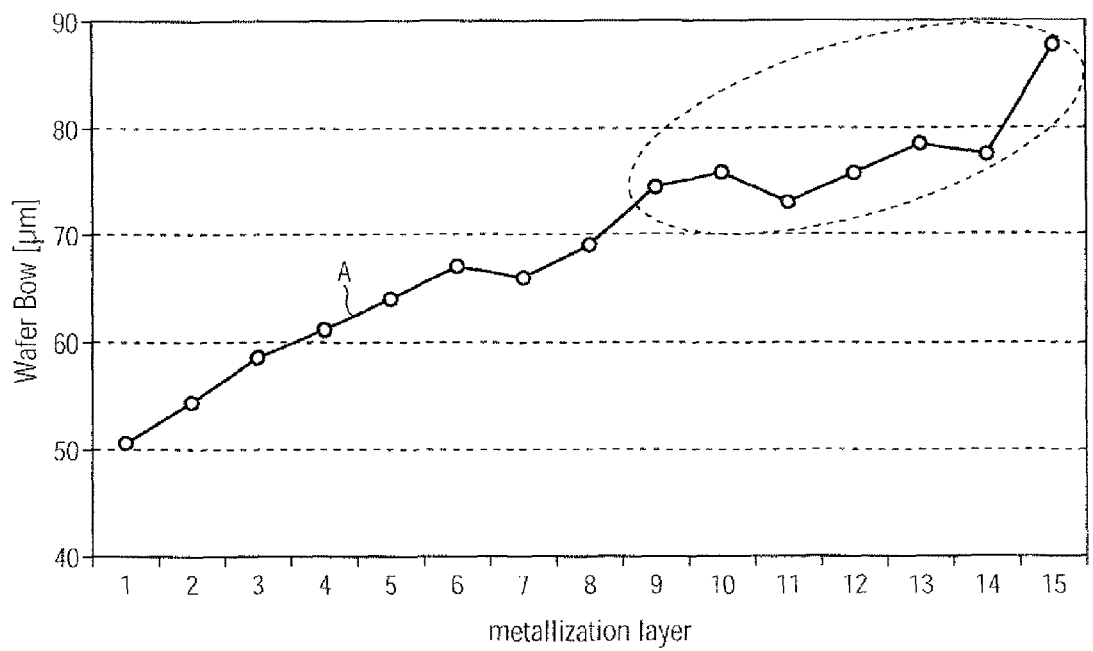
FIG. 2a schematically illustrates a graph depicting the relation between substrate deformation and the number of metallization layers of a complex metallization system, which may be used for identifying a critical degree of substrate deformation, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides techniques and semiconductor devices in which "stress engineering" in the metallization level may be introduced to appropriately balance the overall stress level therein, thereby reducing yield losses, which may conventionally be caused by undue deformation or warpage of substrates when forming complex metallization systems including a plurality of metallization layers. Thus, by providing a dedicated stress compensation layer and/or by appropriately adapting the material characteristics in terms of the internal stress level a certain degree of substrate warpage, which may be caused by providing lower lying metallization layers, may be compensated for to enable the further processing on the basis of reliable substrate handling activities, since the total amount of substrate deformation may be maintained at a level that is not critical for the substrate handling. In other strategies, a plurality of "mild" modifications may be introduced into the overall manufacturing sequence to maintain the overall stress level within a non-critical range, which may be accomplished by identifying the dependency of the overall stress level for a general configuration of a metallization system under consideration and a corresponding manufacturing sequence. For example, if certain metallization layers may be identified as major contributors to the overall stress level and thus the substrate warpage, a corresponding amount of other metallization layers may be appropriately designed to provide for a significant compensation of these layers when a significant modification with respect to the internal stress levels of these layers may be deemed inappropriate with respect to the overall performance of these metallization layers. In other cases, at any appropriate position within the metallization system, a pronounced stress compensation material may be provided, for instance, without significantly affecting the remaining overall configuration of the metallization system to compensate for, or at least balance to a certain degree, the substrate warpage. In other cases, the additional stress compensation materials may contribute, in addition to a reduced warpage, to enhanced performance of the metallization system, for instance with respect to mechanical stability, while in other cases certain process steps may be enhanced, for instance by providing additional etch stop capabilities, anti-reflective coating (ARC) functionality and the like.

With reference to FIGS. 2a-2j, further illustrative embodiments will now be described in more detail, wherein reference may also be made to FIGS. 1a-1b, if appropriate.

FIG. 2a schematically illustrates a graph that depicts a relation between the degree of bending or warpage of a substrate on the number of individual metallization layers in a complex metallization system according to a specific composition of the metallization layers. That is, in general, a specific layout of the individual metallization layers in combination with corresponding materials in the form of conductive metals, barrier materials, dielectric materials, etch stop materials and the like may be specified to obtain a metallization system corresponding to the device requirements. These materials may have to be processed in accordance with well-established manufacturing techniques wherein, however, the type of manufacturing process may significantly depend on the specifics of the metallization system under consideration. For example, curve A as shown in FIG. 2a may represent the degree of substrate warpage or substrate deformation versus the number of metallization layers in a complex metallization system for a specific semiconductor device, such as a microprocessor and the like, wherein it should be appreciated that, in general, the influence of the various metallization layers on the substrate deformation may also significantly depend on the basic characteristics of the substrate used for forming a plurality of semiconductor devices in a common manufacturing state. For example, currently 300 mm is a frequently encountered size of a semiconductor substrate used for forming silicon-based semiconductor devices, while a thickness of the substrate may be in the range of several hundred micrometers. Thus, a corresponding dependency may be determined for a given basic configuration of the metallization system for a given process technology and a specified type of substrate so as to identify a critical state of the substrate warpage. In the example shown in FIG. 2a, the substrate deformation or warpage may be measured as a difference in the height level between the substrate center and the substrate edge after forming respective metallization layers. As illustrated, after forming the first metallization layer the associated degree of substrate warpage may correspond to approximately 50 µm, wherein it should be appreciated that a certain fraction of the measured substrate warpage may be caused by the configuration of a device layer and respective manufacturing techniques. Furthermore, as shown, a substantially linear increase of substrate warpage may be observed when the sixth metallization layer is completed, while, after formation of the seventh metallization layer, a slight reduction of the degree of substrate deformation may be obtained. Thereafter, a further increase of substrate deformation may be observed up to the tenth metallization layer, followed by a slight reduction and a subsequent increase with a quite significant increase for the fifteenth metallization layer. Thus, for the example illustrated in FIG. 2a, in total, a continuous increase of the substrate warpage may be observed wherein, depending on the capabilities of the corresponding substrate handling tools, reliable handling and processing of the substrates may no longer be guaranteed for a value of more than 70 µm. Consequently, upon forming the ninth metallization layer, a significant yield loss may occur due to less reliable manufacturing processes, damage of substrates, or even failure in appropriately positioning a corresponding substrate on a substrate holder. If, for instance, the increasing number of metallization layers may result in a bowl-like deformation of the substrate, i.e., the substrate edges may be pulled up, one or more of the metallization layers 1-8 may be appropriately redesigned to exhibit an increased "compressive" internal stress level to compensate for, at least to a certain degree, the resulting deformation. In other cases, an appropriate additional material layer having the desired magnitude and type of internal stress level may be incorporated into the metallization system prior to forming the ninth metallization layer if any further modifications within the given metallization system are not desired. It should be appreciated that corresponding modifications may be implemented in a plurality of layers to obtain a corresponding behavior, as is shown for layers 7, 11 and 14, which may have the tendency to reduce the degree of substrate warpage. Hence, a corresponding stress compensation mechanism may be implemented at any stage during the formation of a given metallization system so as to be compatible with the desired overall performance of the metallization system and with the overall process strategy.

With reference to the following drawings, corresponding stress compensation mechanisms will be described in more detail.

Figure 2B:
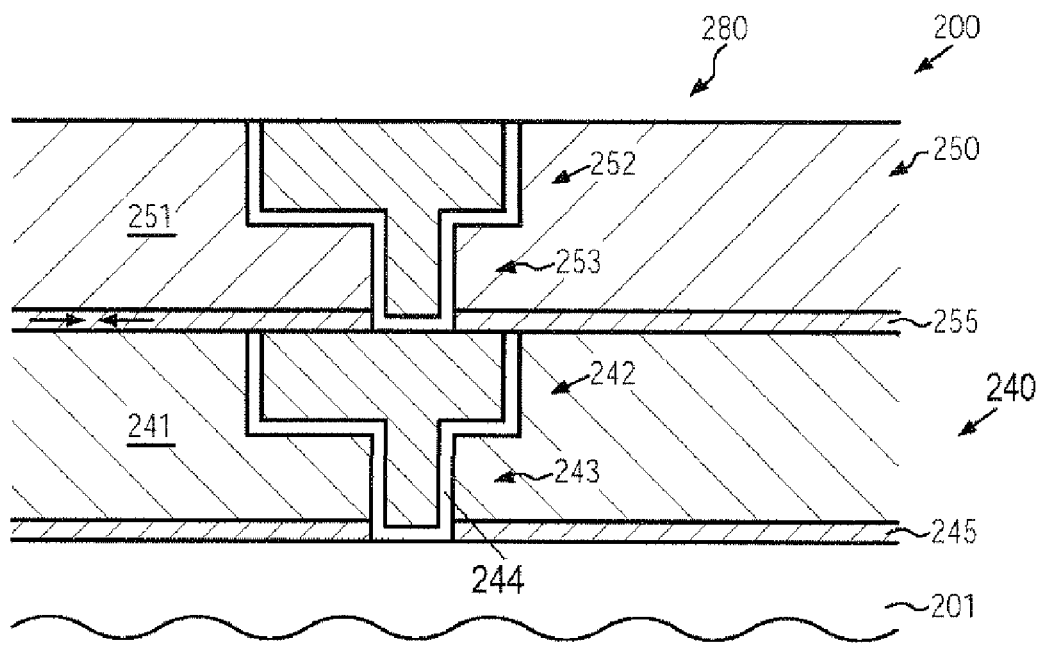
FIGS. 2b-2d schematically illustrate cross-sectional views of a portion of a metallization system including various stress compensation layers, according to illustrative embodiments.

FIG. 2b schematically illustrates a cross-sectional view of a portion of a metallization system 280 of a semiconductor device 200. The semiconductor device 200 may comprise a substrate 201, above which is formed the metallization system 280, which may include any appropriate number of metallization layers. For example, the metallization system 280 may have a similar configuration as is explained with reference to the semiconductor device 100, except for one or more stress compensation mechanisms or layers to maintain the overall warpage of the substrate 201 at a non-critical level. For convenience, two subsequent metallization layers 240 and 250 are illustrated. The metallization layer 240 may comprise an etch stop layer 245 in combination with a dielectric material 241, such as a low-k dielectric material and the like, as is also previously explained, in which a metal line 242 is formed in combination with a via 243. Moreover, a conductive barrier material 244 may be formed to confine a highly conductive material, such as copper and the like, of the metal line 242 and the via 243. Furthermore, the metallization layer 250 may comprise a dielectric material 251 and a corresponding metal line 252 and a via 253. Furthermore, an etch stop layer 255 may be provided, which may also act as a stress compensation layer in order to adjust the overall stress level of the metallization system 280 to maintain the overall warpage of the substrate 201 at a non-critical level, possibly in combination with other stress compensation mechanisms, as will be described later on in more detail. As previously explained with reference to FIG. 2a, for a given basic configuration of the metallization system 280, one or more appropriate locations within the metallization system 280 may be identified in order to implement a corresponding stress compensation mechanism, for instance in the form of the etch stop layer 255, in which an appropriate intrinsic stress level may be created that may counteract the substrate warpage caused by any preceding layer, such as the metallization layer 240, and/or by any further metallization layer that is to be formed above the metallization layer 250.

The etch stop layer 255 may be comprised of any appropriate material which may be deposited on the basis of a desired type and magnitude of intrinsic stress level. For example, it is well known that silicon nitride may be deposited with high internal stress levels, such as compressive stress or tensile stress, with a value up to 3 GPa and higher for compressive stress and 2 GPa and higher for tensile stress by appropriately controlling process parameters of a plasma enhanced deposition process. For instance, frequently, highly stressed silicon nitride material may be used in the contact level of the semiconductor devices to locally induce strain in adjacent channel regions of transistor elements so as to appropriately increase charge carrier mobility and thus performance of these transistor elements. Corresponding process techniques may also be efficiently used for forming the etch stop layer 255 so as to exhibit a desired internal stress level. For example, if generally an overall tensile stress level of the metallization system 280 without compensation may have been determined, for instance on the basis of corresponding measurements as described with reference to FIG. 2a, the etch stop material of the layer 255 may be provided with high compressive stress, thereby compensating for or at least significantly reducing the overall warpage of the substrate 201 for the preceding metallization layers and/or any subsequent metallization layers. In other cases, if a corresponding overall compressive stress level may have been determined during a corresponding measurement sequence, as previously described, the etch stop layer 255 may be provided with high internal tensile stress, which may be accomplished by selecting appropriate process parameters, such as precursor flow rates, temperature, pressure and in particular the degree of ion bombardment during the deposition. It should be appreciated that other materials may also be provided with a high internal stress level, such as nitrogen-containing silicon carbide, which may also be provided with a high internal compressive stress level on the basis of plasma enhanced CVD. Thus, the layer 255 may provide the required etch stop capabilities while at the same time adjusting the overall stress level of the metallization system 280, wherein it should be appreciated that additional stress compensation mechanisms may be implemented, if desired.

Consequently, the metallization system 280 as shown in FIG. 2b may be formed on the basis of well-established process techniques, as is for instance previously described with reference to the semiconductor device 100, wherein, however, during the deposition of the material of the layer 255, appropriate process parameters may be selected in order to obtain a desired type and magnitude of internal stress. Moreover, silicon nitride and nitrogen-containing silicon carbide material also represent well-established materials that may be efficiently used as a cap material for copper-based metals, thereby providing reliable confinement of the metal layer 242. Moreover, these materials may also provide sufficient electromigration performance so that the overall characteristics of the metallization layer 240 may remain substantially unmodified compared to a conventional metallization system without the stress compensation layer 255. Moreover, the layer 255 may provide the desired etch stop capabilities during the patterning of the dielectric material 251, which may thus allow applying well-established patterning regimes in forming the metallization layer 250. Moreover, in addition to providing the etch stop layer as a stress compensation layer in a metallization system in which a high compressive stress component may be required for reducing overall substrate warpage, the layer 255 may additionally provide enhanced mechanical integrity of the metallization system 280 as, for instance, the creation of cracks in the dielectric material 241 may be significantly reduced during corresponding CMP processes, which may typically be used for removing any excess material after filling copper material into the metal line 242. Consequently, overall electrical performance of the metallization system 280 may be maintained, while, additionally, enhanced mechanical integrity may be achieved, for instance for a moderately high compressive stress level, while at the same time a significant reduction of substrate warpage may be accomplished.

Figure 2C:
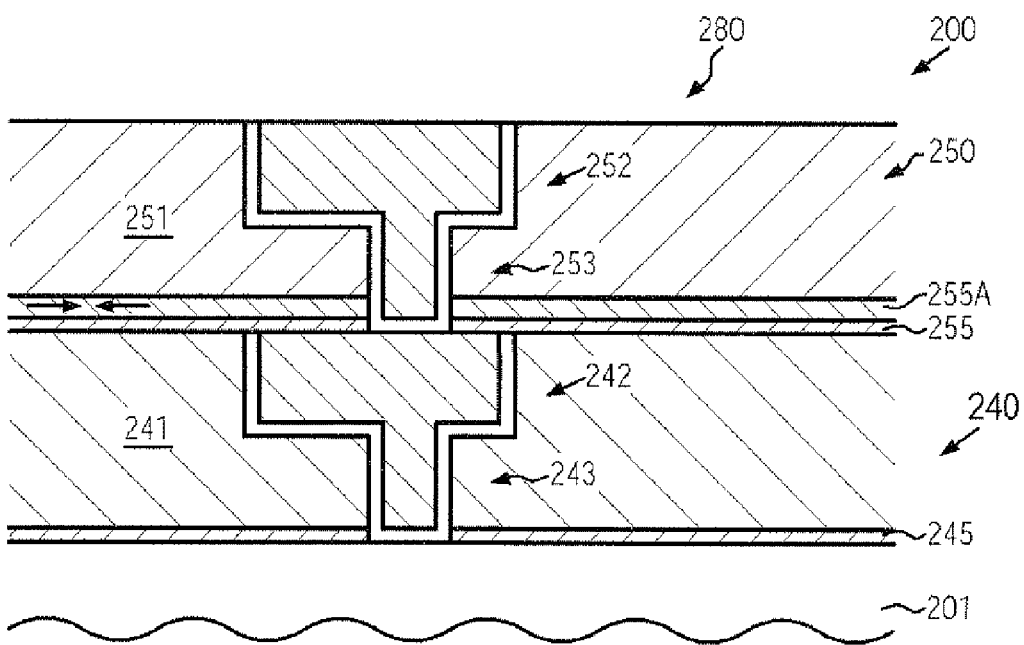

FIG. 2c schematically illustrates the semiconductor device 200 according to further illustrative embodiments in which an additional stress compensation layer 255A may be formed, for instance on the layer 255, when specific interface characteristics are required between the layer 255 and the metal line 242. For instance, the layer 255 may provide superior electromigration performance of the metal line 242, which may be obtained by forming the stress compensation layer 255A in the form of any appropriate material on the layer 255. For example, a highly stressed silicon nitride material may be deposited on the layer 255 by using appropriate process parameters to obtain the desired internal stress level, as explained above. In some illustrative embodiments, an original thickness of the layer 255 may even be reduced compared to conventional strategies, in which the additional stress compensation layer 255A is not provided, since the corresponding etch stop capabilities may be provided by the layer 255A, while the layer 255 may provide the desired interface characteristics. Consequently, a total thickness of the layers 255, 255A may not necessarily be significantly increased, thereby maintaining a high degree of compatibility with a basic configuration of the metallization layer 250. For example, for silicon nitride material, very high stress levels may be obtained, thereby providing the possibility of providing a reduced layer thickness, while nevertheless significantly influencing the overall stress level of the metallization system 280. If a corresponding stress level for a desired thickness of the layer 255A may not be sufficient for compensating for the resulting substrate warpage, additional metallization layers, such as the layer 240 and the like, may also be provided with an additional compensation layer, such as the layer 255A or a corresponding stressed etch stop layer, such as the layer 255 as shown in FIG. 2b.

Figure 2D:
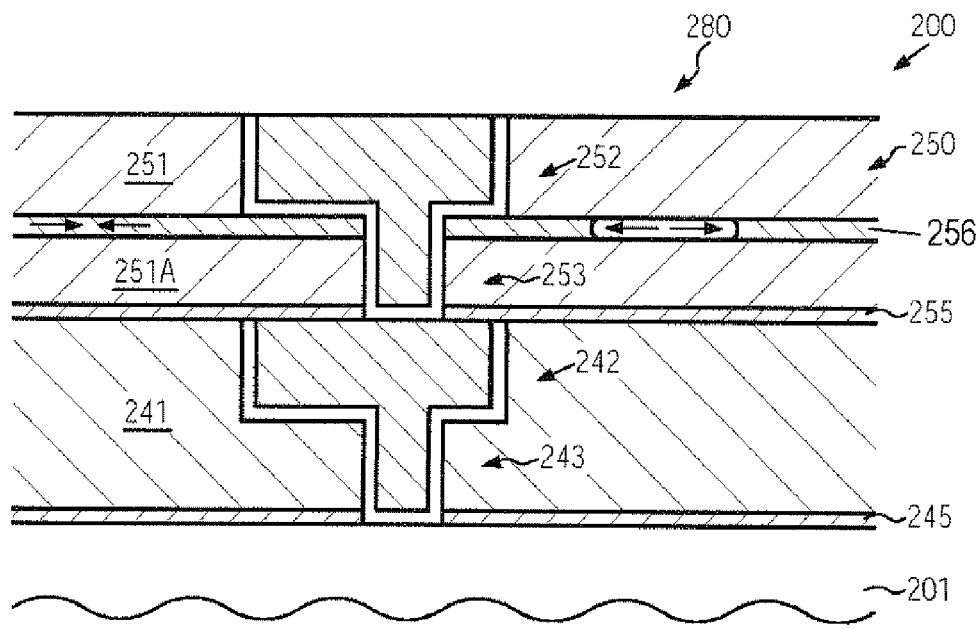

FIG. 2d schematically illustrates the semiconductor device 200 according to further illustrative embodiments in which an additional intermediate stress compensation layer 256 may be provided, for instance, in the metallization layer 250. The intermediate layer 256 may be comprised of any appropriate material, such as silicon nitride, nitrogen-containing silicon carbide, silicon oxynitride and the like, as long as a desired internal stress level may be obtained. Although the intermediate layer 256 may be formed at any desired vertical position, in the embodiment shown, the layer 256 may be used as an etch stop material controlling an etch process for patterning dielectric materials 251, 251A of the metallization layer 250. That is, the vertical position of the stress compensation layer 256 may substantially define a depth or thickness of the metal line 252, thereby contributing to enhanced overall process uniformity during the manufacturing sequence for forming the metallization layer 250. In other cases, in addition to providing etch stop capabilities, the layer 256 may also be used as an anti-reflective coating (ARC), thereby providing additional process efficiency during the complex lithography process. For this purpose, the material composition and the thickness may be selected in correlation with the internal stress level in order to obtain a specific optical thickness of the layer 256 for a corresponding exposure wavelength under consideration. For this purpose, for a given material composition and respective deposition parameter, which may result in a corresponding internal stress level, the thickness of the layer 256 may be appropriately selected so as to obtain a desired optical behavior of the layer 256. For example, after depositing the dielectric material 251A, corresponding process parameters may be changed to deposit an appropriate material for the layer 256 if an in situ deposition process sequence is considered. In other cases, separate deposition processes may be performed for providing the materials 251A and 256. Thereafter, the material 251 may be deposited and may be accomplished in the same deposition chamber or in a separate deposition tool, depending on the material composition of the layer 251 and the overall process strategy. As previously explained, the layer 256 may be provided in a plurality of metallization layers with any appropriate internal stress level in order to obtain a desired reduced degree of substrate warpage, wherein the layer 256 may be provided in combination with one or more of the mechanisms as described above with reference to FIGS. 2b and 2c.

Figure 2E:
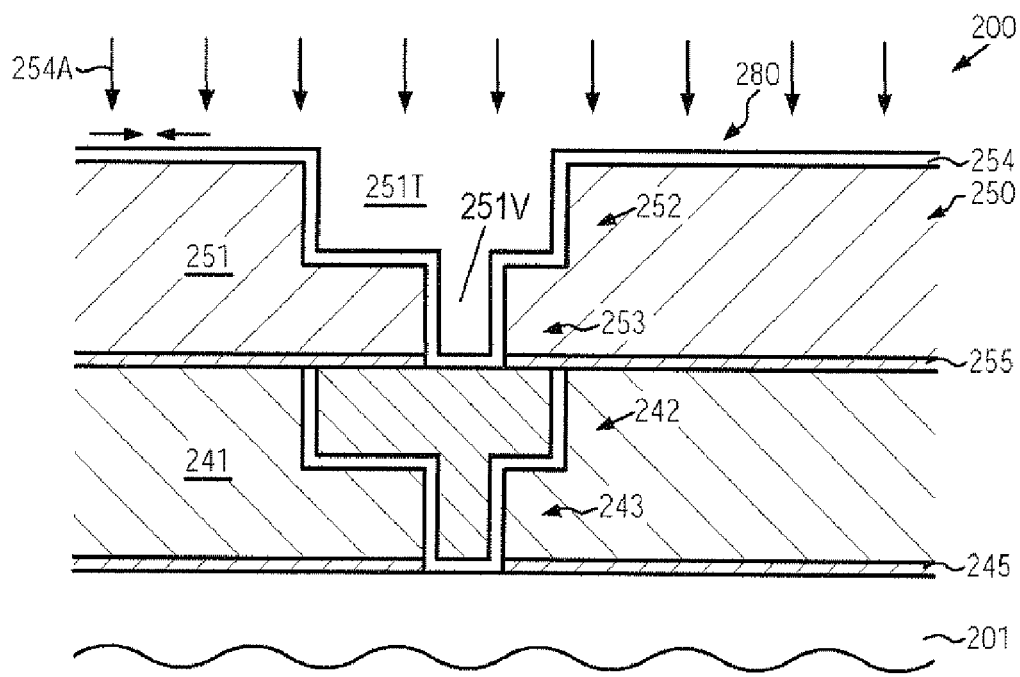
FIG. 2e schematically illustrates a portion of a metallization system receiving a conductive barrier material as a stress compensation component, according to further illustrative embodiments.

FIG. 2e schematically illustrates the semiconductor device 200 according to still further illustrative embodiments in which a conductive barrier material 254 is deposited during a deposition process 254A, the process parameters of which may be adjusted such that a desired degree of internal stress may be created in the layer 254. As illustrated, the material of the layer 254 may be deposited on exposed surface portions of the dielectric material 251, thereby also forming a corresponding barrier material on surface areas of a trench opening 251T and a via opening 251V. It should be appreciated that, although a portion of the layer 254 formed on horizontal portions of the dielectric material 251 may be removed after filling in a metal, such as copper, into the openings 251T, 251V, nevertheless, a significant overall influence on the stress level may be achieved by the remaining portion of the layer 254, since, typically, the metal lines of the metallization layer 250 may represent a significant portion of the metallization layer so that, in total, a significant amount of highly stressed conductive barrier material may be present. It should be appreciated that, as also explained above, the conductive barrier material 254 in the form of a highly stressed material layer may be provided in combination with any of the above-specified stress compensation mechanisms. Furthermore, the stressed conductive barrier material 254 may be provided in any number of metallization layers so as to obtain a desired non-critical degree of substrate warpage.

In one illustrative embodiment, the deposition process 254A may represent a sputter deposition process, for instance for forming a tantalum nitride layer, possibly in combination with a tantalum layer, which may be accomplished by providing a tantalum target material and adding nitrogen to the deposition ambient of the process 254A. For example, the bias power established during the sputter deposition process, in combination with an appropriate control of the nitrogen supply to the deposition ambient, may result in an efficient control mechanism for adjusting the internal stress level of the layer 254.

Figure 2F:
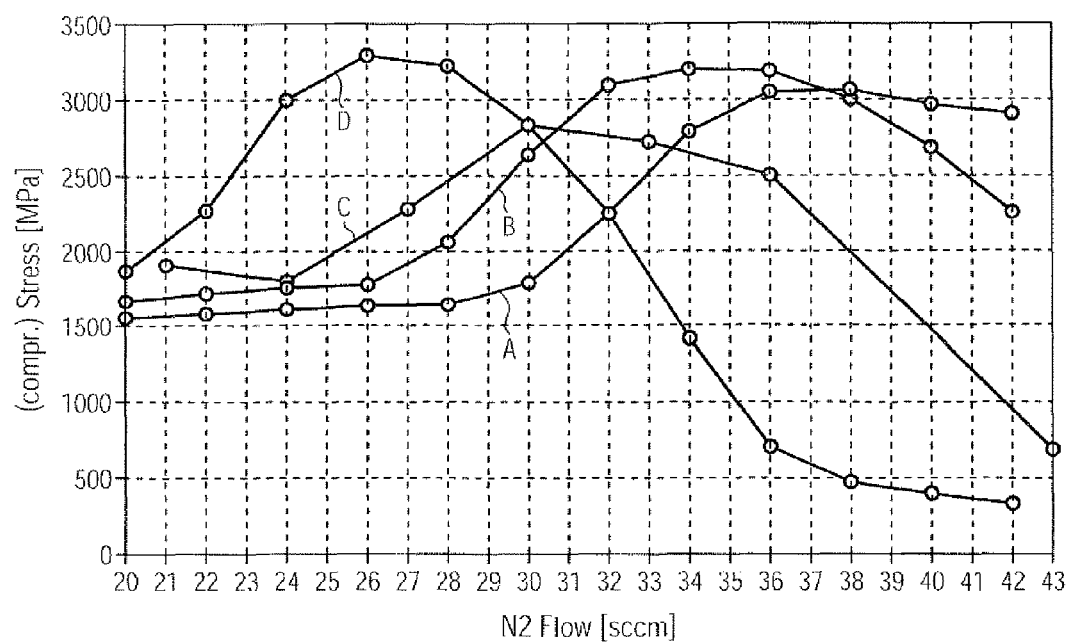
FIGS. 2f-2g schematically illustrate graphs that illustrate the relation of certain process parameters of a sputter deposition process with respect to an internal stress of a conductive barrier material, according to illustrative embodiments.

FIG. 2f schematically illustrates a graph illustrating the relation between the internal stress level of the layer 255, for instance in the form of a tantalum nitride layer, with respect to the nitrogen concentration, for instance given as a flow rate for a specific deposition tool, while also different values of DC bias power are used. As illustrated, curve A may represent a moderately high bias power wherein the compressive stress level of the layer 255 may be significantly increased above a specific nitrogen flow rate. Similarly, curve B may represent a lower DC bias power, wherein a corresponding increase of the compressive stress level may occur at a lower flow rate. Curve C illustrates the relation between compressive stress and nitrogen flow rate for an even further reduced DC bias power, and finally curve D may represent the corresponding relation for a still lower bias power. Consequently, a significant change of compressive stress level may be obtained, for instance, by selecting a specific bias power, such as represented by curve D, and appropriately adjusting the nitrogen concentration in the deposition ambient.

Figure 2G:
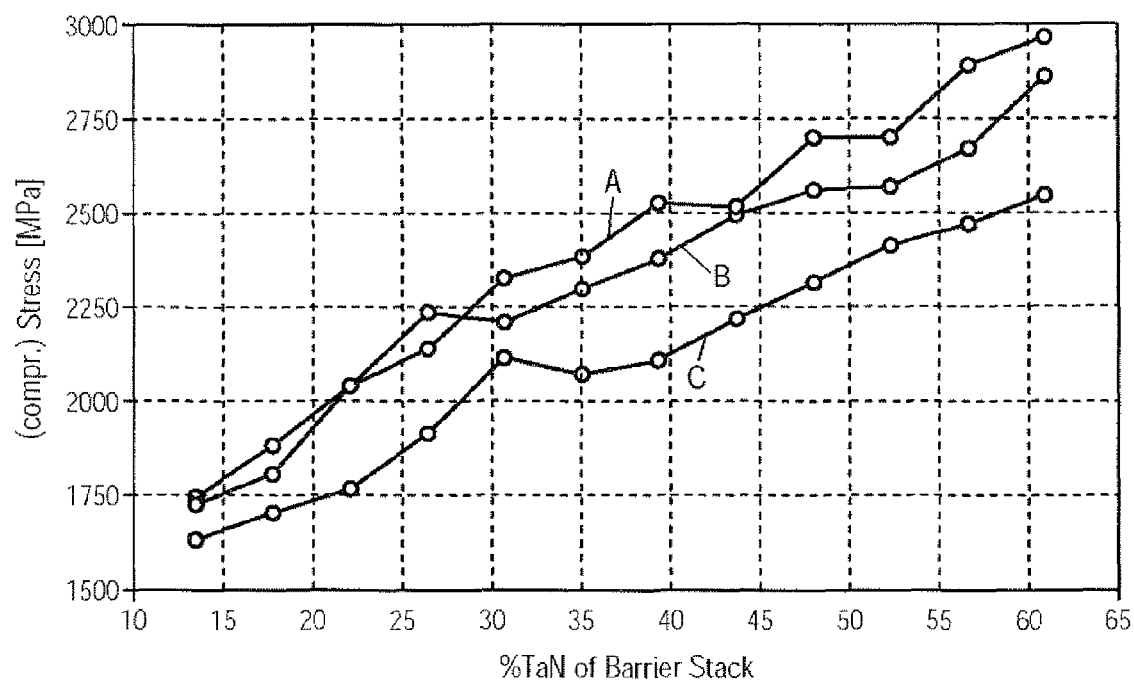

FIG. 2g schematically illustrates a relation between compressive stress levels of the layer 254 with respect to the contents of tantalum nitride within the barrier layer 254 formed on the basis of various process temperatures. That is, the barrier layer 254 may be formed on the basis of tantalum and tantalum nitride and a moderately low fraction of tantalum nitride may result in a corresponding moderately low compressive stress level wherein, however, a higher temperature may result in a lower stress level, as indicated by curves A-C, wherein curve A may represent the highest temperature and curve C may represent the lowest temperature. Thus, by increasing the percentage of tantalum nitride within the barrier layer 254, generally, an increased compressive stress level may be obtained, wherein a further enhancement of the stress level may be accomplished by selecting an appropriate temperature.

Thus, a plurality of control mechanisms may be provided to obtain a desired high stress level in the layer 254, substantially without contributing to additional process complexity.

Figure 2H:
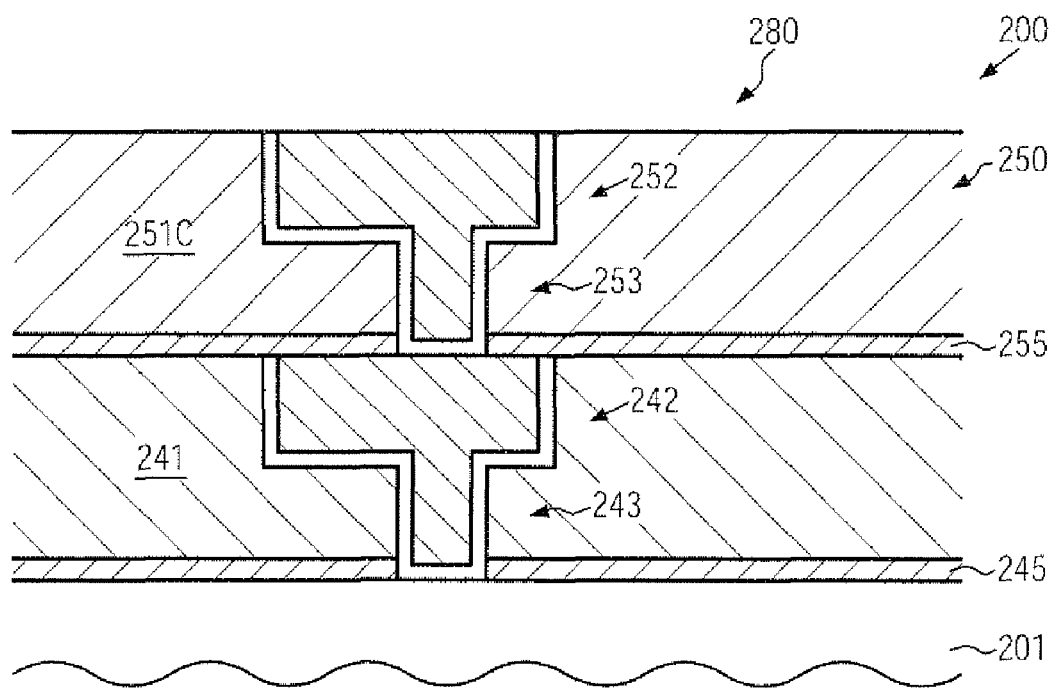
FIGS. 2h-2i schematically illustrate cross-sectional views of a portion of a metallization system in which dielectric materials, such as low-k dielectric materials, may be used for adapting the overall stress characteristics of a metallization system, according to still further illustrative embodiments.

FIG. 2h schematically illustrates the semiconductor device 200 according to further illustrative embodiments in which the interlayer dielectric material of the metallization layer 250, indicated as 251C, may be provided so as to adjust the stress level of the metallization system 280. For instance, frequently, low-k materials or ULK materials may be used in view of reducing the overall parasitic capacitance within the metallization layers of the system 280. However, in many cases, the same material, such as a low-k material, may be used in several metallization layers in view of process strategy while not necessarily a significant gain in performance of certain metallization layers may be accomplished. That is, in some metallization levels, electrical performance may be substantially determined by overall conductivity of the metal lines, while the total relative permittivity may be less critical. In this case, a low-k material may be replaced by a dielectric material having a somewhat higher k value, which may thus typically be provided in the form of a material having a certain degree of compressive stress level or may have a reduced tensile stress level. It should be appreciated in this respect that, frequently, dielectric materials having a low dielectric constant may be provided as a tensile stressed material, wherein provision of a large number of metallization layers, each of which may comprise a tensile stressed low-k dielectric material, may finally result in undue tensile stress and thus a corresponding substrate warpage. Hence, by replacing the low-k material by a material of somewhat higher k values, a significant reduction of the overall warpage may be accomplished, while nevertheless not unduly contributing to reduced electrical performance.

In other illustrative embodiments, an increased degree of overall compressive stress may be reduced by replacing certain dielectric materials, such as fluorine-doped silicon dioxide and the like, which are typically provided with a compressive stress level, by a low-k dielectric material, which may be formed on the basis of a tensile stress level, as explained above, thereby also efficiently compensating for a non-desired overall compressive stress level while at the same time reducing the overall parasitic capacitance of these metallization levels. Thus, depending on the type of stress required for compensating for the substrate deformation, the dielectric materials of one or more metallization layers may be replaced by a corresponding material of lower dielectric constant or higher dielectric constant.

Figure 2I:
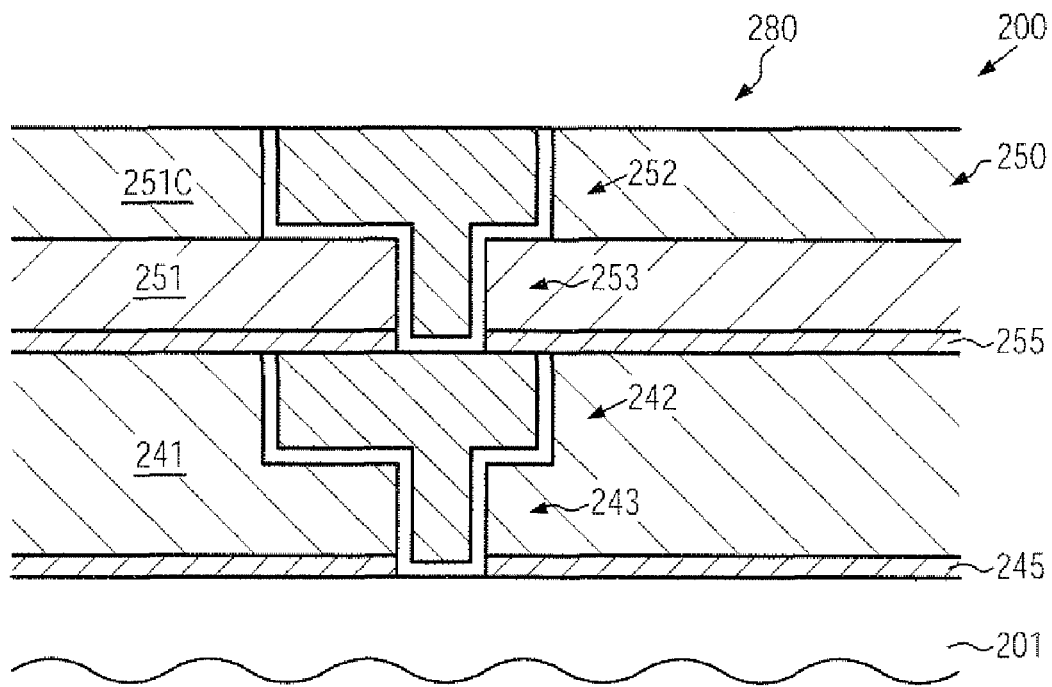

FIG. 2i schematically illustrates the device 200 according to further illustrative embodiments in which a portion of the interlayer dielectric material may be replaced by a corresponding dielectric material of different stress levels. In the embodiment shown, the interlayer dielectric material 251, which may comprise a material of higher dielectric constant, may be partially replaced by the material 251C having a reduced dielectric constant and thus may exhibit an internal tensile stress level. In this case, overall electrical performance of the metallization layer 250 may be enhanced since the parasitic capacitance between neighboring metal lines may be reduced due to the provision of the layer 251C, while the material 251 may still provide a desired degree of mechanical integrity wherein, however, the influence of the material 251 with respect to substrate warpage may at least be partially compensated for by the material 251C.

Figure 2J:
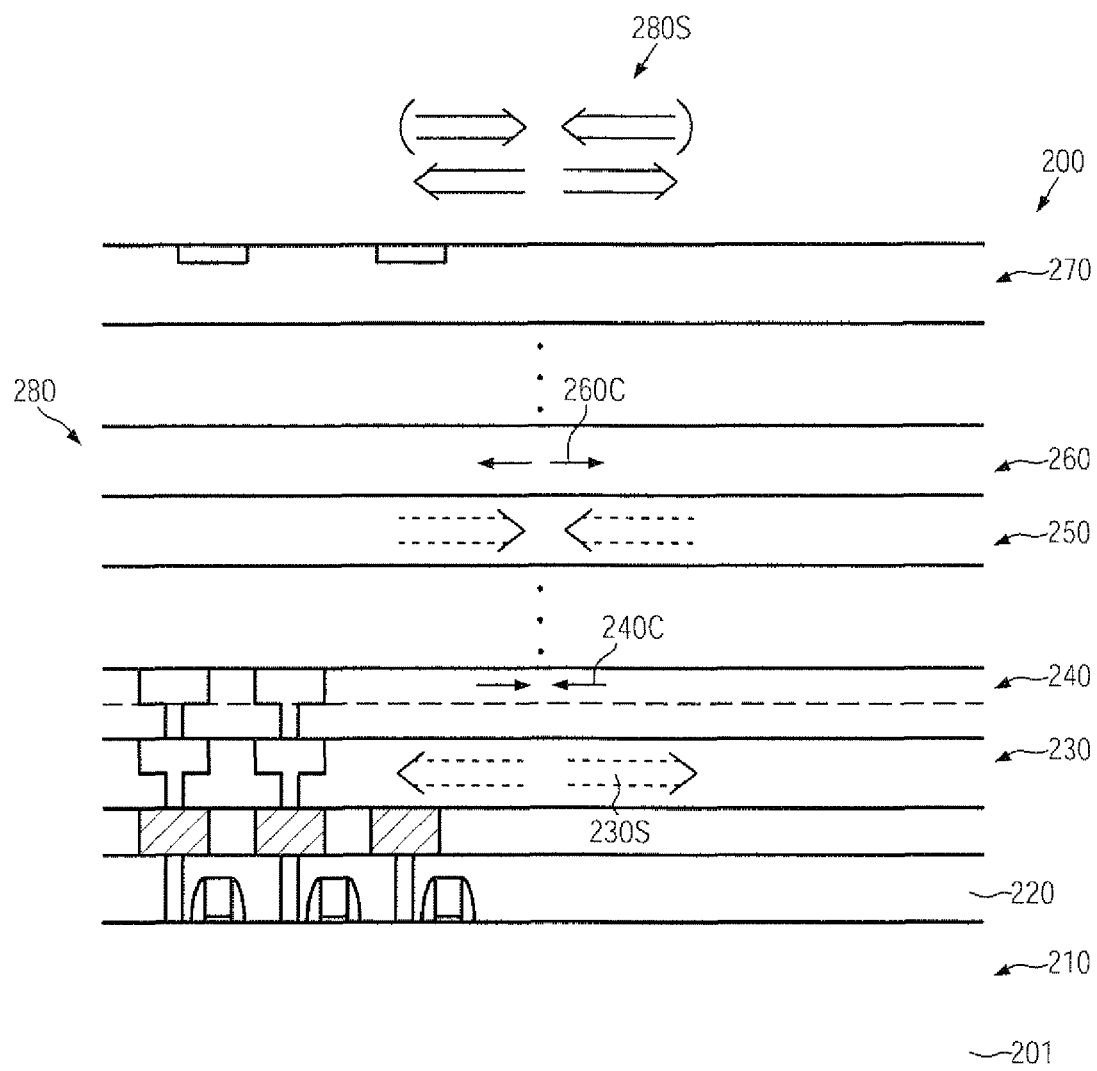
FIG. 2j schematically illustrates a semiconductor device including a complex metallization system which may comprise one or more stress compensation regions to balance the overall stress of the metallization system for maintaining overall substrate warpage at a non-critical level, according to still further illustrative embodiments.

FIG. 2j schematically illustrates the semiconductor device 200 in an advanced manufacturing stage. As illustrated, the metallization system 280 may comprise a plurality of metallization layers 220, 230, 240, 250, 260, 270, at least one of which may include a stress compensation mechanism, as is, for instance, described above with reference to FIGS. 2b-2i. Furthermore, the device 200 may comprise a device level 210 which may include a plurality of circuit elements, such as transistors and the like, which may be connected to a first metallization layer 230 by means of a contact structure 220. With respect to the device layer 210 and the contact layer 220, the same criteria may apply as previously explained with reference to the semiconductor device 100. Moreover, as illustrated, one or more of the metallization layers formed above the contact layer 220 may have a moderately high internal stress level, indicated as 230S, which would, possibly in combination with a corresponding stress level created in the device layer 210 and the contact layer 220, result in undue substrate warpage. In this case, the layer 240 may be provided so as to include a stress compensation mechanism 240C, for instance in the form of any stress compensation layer, as previously explained, to compensate for the stress 230S. Hence, in some illustrative embodiments, at least one stress compensation mechanism, such as the mechanism 240C, may be provided in the neighborhood of a stressed metallization layer, such as the metallization layer 230, to reduce the overall effect thereof and provide reliable substrate handling during the formation of the metallization system 280. Similarly, further stress compensation mechanisms may be provided within the system 280, as may be considered appropriate on the basis of, for instance, respective measurements, as previously described with reference to FIG. 2a. For example, a stress compensation mechanism 260C may be implemented, for instance in the form of the above-described stress compensation layers, thereby contributing to a non-critical deformation state of the substrate 201. Thus, due to the presence of the one or more stress compensation mechanisms 240C, 260C, an overall stress level 280S may be maintained in a non-critical state, so that yield losses caused by non-reliable attachment of substrates to substrate holders and the like may be significantly reduced.

As a result, the present disclosure provides techniques and semiconductor devices in which stress compensation mechanisms may be implemented in the form of one or more stress compensation layers within one or more metallization layers in order to maintain substrate deformation at a non-critical level. For this purpose, a basic manufacturing flow and a corresponding basic configuration of a metallization system may be examined with respect to undue substrate deformation in order to identify appropriate vertical positions within the metallization system in order to implement one or more stress compensation mechanisms. For instance, additional highly stressed dielectric materials may be provided within the metallization system at any appropriate position, thereby efficiently compensating for undue substrate deformation. In other cases, in addition to or alternatively to providing additional highly stressed dielectric materials, functional layers in one or more of the metallization layers may be appropriately modified or replaced by a dielectric material having an appropriate internal stress level. For instance, the interlayer dielectric material, the etch stop materials, the conductive barrier material and the like of one or more metallization layers may be appropriately provided with an internal stress level that may compensate for undue substrate deformation.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   determining a degree of warpage of a first substrate when performing a manufacturing sequence for forming a plurality of metallization layers of a first metallization system of a specified type of semiconductor device above said first substrate; and
   adjusting an overall stress level in a second metallization system on the basis of said determined degree of warpage when forming said second metallization system of said specified type of semiconductor device above at least one second substrate by adapting an inherent stress level of a conductive barrier material of said second metallization system so as to reduce an overall stress level in said second metallization system on the basis of said determined degree of warpage.

2. The method of claim 1, wherein adjusting an overall stress level comprises providing an additional stress compensation layer in said second metallization system.

3. The method of claim 2, wherein providing said additional stress compensation layer comprises forming a first dielectric material above a metal region of a first metallization layer and forming material of said additional stress compensation layer above said first dielectric material with an internal stress level so as obtain a reduced warpage of said second substrate, and forming a second dielectric material of a second metallization layer above said additional stress compensation layer.

4. The method of claim 3, wherein said additional stress compensation layer is formed on said first dielectric material and wherein said first dielectric material is used as an etch stop material when patterning said second dielectric material of said second metallization layer.

5. The method of claim 3, wherein said additional stress compensation layer is formed within said second dielectric material.

6. The method of claim 5, further comprising using said additional stress compensation layer as at least one of an anti-reflective material and an etch stop material during the patterning of said second dielectric material.

7. The method of claim 1, wherein adapting an inherent stress level of at least one material layer of said second metallization system comprises providing an etch stop material with an intrinsic stress level of at least approximately 200 MPa or higher.

8. The method of claim 1, wherein controlling an intrinsic stress level of said conductive barrier material comprises controlling at least one of a DC power, a precursor flow rate and a deposition temperature in a sputter deposition process.

9. The method of claim 1, wherein adapting an inherent stress level of at least one material layer of said second metallization system comprises providing at least a portion of an interlayer dielectric material of at least one metallization layer of said second metallization system so as to reduce said determined degree of warpage.

10. The method of claim 9, wherein a fraction of low-k dielectric material is increased in said at least one metallization layer of said second metallization system compared to a corresponding metallization layer of said first metallization system.

11. A method, comprising:
    determining a degree of warpage of a first substrate when performing a manufacturing sequence for forming a plurality of metallization layers of a first metallization system of a specified type of semiconductor device above said first substrate; and
    adjusting an overall stress level in a second metallization system on the basis of said determined degree of warpage when forming said second metallization system of said specified type of semiconductor device above at least one second substrate so as to reduce an overall stress level in said second metallization system, wherein adjusting the overall stress level comprises adapting an inherent stress level of at least one material layer of said second metallization system by providing at least a portion of an interlayer dielectric material of at least one metallization layer, wherein a fraction of low-k dielectric material is increased in said at least one metallization layer of said second metallization system compared to a corresponding metallization layer of said first metallization system.

12. The method of claim 11, wherein adjusting an overall stress level comprises providing an additional stress compensation layer in said second metallization system.

13. The method of claim 12, wherein providing said additional stress compensation layer comprises forming a first dielectric material above a metal region of a first metallization layer and forming material of said additional stress compensation layer above said first dielectric material with an internal stress level so as obtain a reduced warpage of said second substrate, and forming a second dielectric material of a second metallization layer above said additional stress compensation layer.

14. The method of claim 13, wherein said additional stress compensation layer is formed on said first dielectric material and wherein said first dielectric material is used as an etch stop material when patterning said second dielectric material of said second metallization layer.

15. The method of claim 13, further comprising using said additional stress compensation layer as at least one of an anti-reflective material and an etch stop material during the patterning of said second dielectric material.

16. The method of claim 13, wherein said additional stress compensation layer is formed within said second dielectric material.

* * * * *